United States Patent [19]

Kudo et al.

[11] Patent Number: 5,061,599
[45] Date of Patent: Oct. 29, 1991

[54] RADIATION SENSITIVE MATERIALS

[75] Inventors: Tetsuichi Kudo, Tokyo; Akira Ishikawa, Kokubunji; Hiroshi Okamoto, Ome; Katsuki Miyauchi, Hino; Takao Iwayanagi; Fumio Murai, both of Tokyo; Shinji Okazaki, Urawa, all of Japan

[73] Assignee: Hitachi, Ltd., Tokyo, Japan

[21] Appl. No.: 462,856

[22] Filed: Jan. 5, 1990

Related U.S. Application Data

[63] Continuation of Ser. No. 58,822, Jun. 5, 1987, abandoned.

[30] Foreign Application Priority Data

Jun. 11, 1986 [JP] Japan ................. 61-133665
Sep. 22, 1986 [JP] Japan ................. 61-221863
Mar. 5, 1987 [JP] Japan ................. 62-48668

[51] Int. Cl.$^5$ ................................. G03C 1/72
[52] U.S. Cl. .............................. 430/270; 252/186.43; 252/600; 423/415 P; 423/582; 423/584; 423/606
[58] Field of Search ............ 252/186.43, 600, 963; 423/415 P, 582, 584, 606; 350/357, 582; 430/270

[56] References Cited

U.S. PATENT DOCUMENTS

| | | | |
|---|---|---|---|
| 2,895,892 | 7/1959 | Chalkley | 252/186.43 |
| 3,451,764 | 6/1969 | MacWilliams | 423/606 X |
| 3,859,373 | 1/1975 | Seitzer | 423/606 X |
| 4,116,859 | 9/1978 | Merkl | 252/186.43 |
| 4,272,164 | 6/1981 | Trussell Jr. | 350/357 |
| 4,325,611 | 4/1982 | Huggins et al. | 252/600 |
| 4,338,000 | 7/1982 | Kamimori et al. | 252/600 |
| 4,339,424 | 7/1982 | Jacobsen et al. | 423/606 |
| 4,345,982 | 8/1982 | Ikawa et al. | 204/129 |
| 4,483,997 | 11/1984 | McEntire et al. | 549/529 |
| 4,522,934 | 6/1985 | Shum | 502/210 |
| 4,533,527 | 8/1985 | Farrell et al. | 423/53 |
| 4,634,585 | 1/1987 | Kudo et al. | 423/606 X |
| 4,935,336 | 6/1990 | Yamada et al. | 430/270 X |
| 4,985,349 | 1/1991 | Ohkawa et al. | 430/270 X |

FOREIGN PATENT DOCUMENTS 2759117 7/1979 Fed. Rep. of Germany ...... 423/606
60251130 12/1985 Japan ................... 423/606

OTHER PUBLICATIONS

Keslop, Inorg. Chem., Elsevier Publ. Co., pp. 448–449, 1960.
Kirk–Othmer Encyclopedia of Chemical Technology 3rd Ed. vol. 17, 1982 pp. 20–21.
Bailar, Comprehensive Inorganic Chemistry, Pergamon Press, p. 769, 1974.

Primary Examiner—Catherine S. Kilby Scalzo
Attorney, Agent, or Firm—Antonelli, Terry, Stout & Kraus

[57] ABSTRACT

A radiation-sensitive material comprising a polyacid composed of tungsten and niobium, titanium and/or tantalum. A uniform film can be formed by an easy spin coating method. The polyacid has a radiation sensitivity higher than that of a polyacid comprising only tungsten.

6 Claims, 1 Drawing Sheet

RADIATION SENSITIVE MATERIALS

This application is a continuation of application Ser. No. 058,822, filed June 5, 1987 abandoned.

BACKGROUND OF THE INVENTION

The present invention relates to radiation-sensitive materials capable of forming a uniform film by an easy, inexpensive spin coating method.

For forming a thin film of an inorganic resist material, taking advantage of a photosensitivity of a thin film of an amorphous chalcogenide, a vacuum technique such as vacuum evaporation or sputtering has been necessitated as described in Japanese Patent Laid-Open No. 27137/1981. However, these so-called dry processes have defects that an expensive apparatus and a troublesome operation are necessitated, that a long time is required for forming the film and that the productivity is insufficient. On the other hand, organic resists comprising an organic polymer material have been used widely, since they are capable of forming a uniform, excellent coating film by an easy, inexpensive spin coating method. The development of an inorganic resist material capable of forming a film by a simple coating method has eagerly been demanded, since it has a high durability to oxygen plasma and a high photo absorbance unlike the organic resist materials.

An inorganic resist material comprising a polytungstate which satisfies the above-mentioned demands has been disclosed in Japanese Patent Laid-Open No. 114081/1985.

However, the inorganic resist material comprising the polytungstate has a defect that its sensitivity to radiations is slightly lower than that of the ordinary organic resists.

SUMMARY OF THE INVENTION

An object of the present invention is to provide an inorganic resist comprising a polytungstate and having a high sensitivity.

Another object of the present invention is to provide a radiation-sensitive material comprising a polyacid composed of tungsten and at least one metal selected from the group consisting of niobium, titanium, and tantalum.

DETAILED DESCRIPTION OF PREFERRED EMBODIMENTS

Figure 1A:
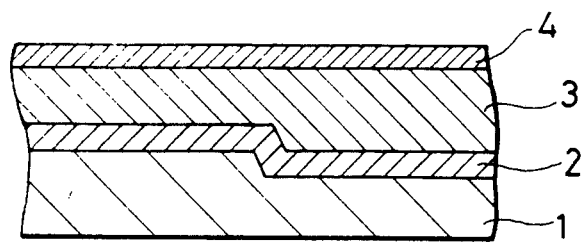
FIGS. 1(a), 1(b) and 1(c) are flow sheets showing a bi-layer process according to the present invention.

The radiation-sensitive material of the present invention comprises a polytungstate in which the tungsten atom is partially replaced with at least one of niobium (Nb), titanium (Ti) and tantalum (Ta).

The structure of the polytungstate disclosed in Inorg. Chim. Acta 111, pages L27 to 28 (1986) or Japanese Patent Laid-Open No. 114081/1985 is unknown, since it is obtained only as an amorphous compound. However, it is supposed from the structures of other polyacids that the polytungstate has a network structure in which $WX_6$ (X being an oxygen, a peroxo group (O—O) or an anion such as OH) octahedra are connected together directly or via a molecule of another compound such as water. When the tungsten atom in the polytungstate of the present invention is partially replaced with Nb, part of $WX_6$ octahedra are replaced with $NbX_6$ octahedra. Similarly, when it is partially replaced with Ti or Ta, part of $WX_6$ octahedra are replaced with $TiX_6$ or $TaX_6$ octahedra, respectively.

When the element(s) used in the replacement is(are) Nb and/or Ti, the polyacid of the present invention is prepared by reacting an aqueous hydrogen peroxide solution on a mixture of metallic tungsten powder (or tungsten carbide) and niobium carbide (or metallic niobium) and/or titanium carbide (or metallic titanium) powder. The empirical formula (general formula) of the polyacid as determined according to the elemental analysis and thermal analysis is as follows:

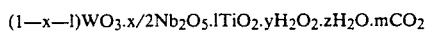

$$(1-x-l)WO_3.x/2Nb_2O_5.lTiO_2.yH_2O_2.zH_2O.mCO_2$$

wherein $0 < x+l < 1$, $0 < y \leq 1$, $0.16 < z < 4$ and $0 \leq m \leq 0.25$.

In the above general formula for the radiation-sensitive material of the present invention, either x or l may be 0 and a particularly preferred range of x+l is $0 < x+l \leq 0.5$.

When the element used in the replacement is Ta, the polyacid of the present invention is prepared by reacting an aqueous solution of tantalum ethoxide [$Ta(OC_2H_5)_5$] in an alcohol with an aqueous solution of hydrogen peroxide to obtain a solution of peroxopolytantalic acid and this solution is mixed with a solution of peroxopolytungstic acid.

According to the elemental analysis and thermal analysis, it was confirmed that the peroxopolyacid comprising tungsten and tantalum has the following empirical formula:

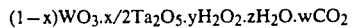

$$(1-x)WO_3.x/2Ta_2O_5.yH_2O_2.zH_2O.wCO_2$$

wherein $0 < x < 1$, $0 < y \leq 1$, $0.16 < z < 4$ and $0 \leq w \leq 0.25$.

When the peroxopolytungstic acid is obtained from metallic W, w is 0 and when it is obtained from tungsten carbide (WC), w is a value in the range of $0 < w \leq 0.25$.

The radiation-sensitive material of the present invention can be used in the form of a solution in water or in a mixture of water and an organic solvent. The organic solvent may be any of those miscible with water to form a substantially homogeneous mixture. To control the evaporation during the storage, it is particularly preferred that the radiation-sensitive material has a vapor pressure of as low as 100 Torr or below at room temperature (20° C.). Examples of them include 2-ethoxyethanol, 2-butoxyethanol, bis-2-methoxyethyl ether and 2-butanol. They can be used either singly or as a combination of two or more of them. Though the effects of the organic solvent such as improvement of the coating property can be exhibited even when the organic solvent is used in a small amount, the amount thereof is preferably 10 to 90 vol. % based on the total solvent.

The developers for the materials of the present invention include various ones as will be described in the following examples. Among them, those prepared by adding an acetate to an aqueous solution having a pH of 2 to 5, such as aqueous solutions of sulfuric acid to which an acetate such as sodium acetate or potassium acetate has been added are preferred. When such a developer is used, a reduction in thickness in the exposed region is minimized and a resist pattern having a high contrast can be obtained.

The radiation-sensitive material of the present invention comprising a polyacid of tungsten and niobium, titanium and/or tantalum has advantages that it is capable of forming a uniform, thin film by the spin coating method and that it has a high durability to oxygen plasma like a polyacid comprising only tungsten as disclosed in Japanese Patent Laid-Open No. 114081/1985. The material of the present invention is superior to the polyacid comprising only tungsten in the sensitivity to U.V. rays, electron beams and X-rays due to the addition of niobium, titanium and/or tantalum.

Thus, the polyacid comprising (1) tungsten and (2) niobium, titanium and/or tantalum constitutes the radiation-sensitive material capable of forming a uniform coating film by the spin coating method.

An embodiment of the process for forming a pattern by a bi-layer resist method with the material of the present invention is as follows: a bottom layer comprising an organic polymer film and an upper layer comprising a coating film of the material of the present invention are formed. A desired pattern is formed on the coating film according to lithography. The bottom layer comprising the organic polymer film is etched with oxygen plasma while the upper layer comprising the coating film having a strong durability to oxygen plasma acts as an etching mask to replicate the pattern.

The following examples will further illustrate the present invention.

EXAMPLE 1

A polyacid comprising tungsten and niobium was prepared as follows: 8.82 g of metallic tungsten powder was mixed with 1.26 g of niobium carbide powder. The mixture was placed in a beaker. 70 ml of a 15% aqueous solution of $H_2O_2$ was added thereto. After a vigorous reaction accompanied with foaming had substantially been completed, about 15 ml of a 30% aqueous solution of $H_2O_2$ was added thereto and the mixture was left to stand at room temperature. Substantially all of the compounds were dissolved therein and a pale yellow, acidic solution was prepared. Insoluble matters and undissolved matters were removed by filtration to obtain a clear solution. A platinized platinum net was immersed in the solution to decompose unreacted $H_2O_2$. The product was dried at room temperature to 120° C. to obtain a yellow, amorphous solid. According to the results of the elemental analysis and thermal analysis, the product had the following empirical formula:

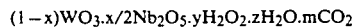

$(1-x)WO_3 \cdot x/2 Nb_2O_5 \cdot yH_2O_2 \cdot zH_2O \cdot mCO_2$ wherein $x \approx 0.2$, $0 < y \leq 1$, $0.16 < z < 4$ and $0 < m \leq 0.06$.

A reason why the values of y, z and m are given not definitely but in the ranges is that they vary depending on the conditions which cannot be controlled easily, such as the time for which the material is left to stand in the course of the preparation, drying conditions, degree of removal of excess $H_2O_2$ and humidity in the storing atmosphere.

1 part by weight of the obtained polyacid comprising tungsten and niobium was dissolved in 1 part by weight of water. 2-Ethoxyethanol was added to the solution to prepare a resist solution. This solution was applied to a silicon wafer having an oxide layer formed thereon by spin coating. After drying, a coating film having a thickness of about 0.1 μm was obtained. Then, the substrate was exposed to a light of a 600 W Xe-Hg lamp at a distance of 35 cm through a chromium mask for 1 sec.

After the exposure followed by the development with an aqueous sulfuric acid solution of pH 2, the resist film in an unexposed region was removed by dissolution to form a pattern composed of recurring, alternate lines having a width of 0.5 μm and spaces having a width of 0.5 μm.

EXAMPLES 2 TO 5

Four polyacids having varied Nb to (W+Nb) molar ratios as shown in Table 1 were prepared in the same manner as in Example 1 except that the mixing ratio of metallic tangsten powder to niobium carbide powder was varied. Resist solutions were prepared from the polyacids in the same manner as in Example 1 and the recurring pattern of the lines and spaces each having a width of 0.5 μm was formed. The minimum exposure times for the patterning are also shown in Table 1.

TABLE 1

| Example | Molar ratio of Nb to (W + Nb) in polyacid | Minimum exposure time (sec) |
|---|---|---|
| 2 | 0.1 | 1.5 |
| 1 | 0.2 | 1.0 |
| 3 | 0.3 | 0.8 |
| 4 | 0.4 | 0.8 |
| 5 | 0.5 | 0.9 |
| Comp. Ex. | 0 | 90 |

In the comparative example shown in Table 1, the poly acid was prepared from only metallic tungsten powder in the same manner as in Example 1 and it comprised only tungsten. An exposure time of 0.8 to 1.5 sec was enough when the sensitive materials comprising Nb-containing polyacids in Examples 1 to 5 of the present invnetion were used, while 90 sec was necessitated for forming the 0.5 μm line-and-space recurring pattern in the comparative example. The sensitivity-improving effect of Nb is apparent from these results.

Although it was tried to prepare a polyacid comprising only niobium and no tungsten, the intended product could not be prepared in the same manner as in Example 1.

EXAMPLE 6

A carbon-free polyacid comprising tungsten and niobium was prepared from 8.82 g of metallic tungsten powder and 1.11 g of metallic niobium powder in the same manner as in Example 1. The infrared spectrum of the product was nearly the same as those of the carbon-containing polyacids prepared in Examples 1 to 5 except that a band due to carbon at 1300 to 1400 cm$^{-1}$ was not observed. It was supposed, therefore, that the presence of carbon exerts no influence on the basic structure of the polyacid.

A resist solution was prepared from the carbon-free polyacid in the same manner as in Example 1. Further, the 0.5 μm line-and-space recurring pattern was formed in the same manner as in Example 1. The exposure time necessitated for the patterning was about 1 sec. This fact indicated that the sensitivity was the same as that containing carbon prepared in Example 1.

EXAMPLE 7

A polyacid comprising tungsten and niobium was prepared from 9.40 g of tungsten carbide powder and 1.26 g of niobium carbide powder in the same manner as in Example 1. It was found that the molar ratio of C to (W+Nb) in the polyacid was 0.25. The coating film prepared from the polyacid was exposed and devleoped in the same manner as in Example 1 to form a negative pattern having a good shape. The exposure time for the patterning was about 1 sec.

EXAMPLE 8

The coating film of the polyacid comprising tungsten and niobium prepared in Example 1 was irradiated with $1 \times 10^{-5}$ C/cm$^2$ of electron beams (acceleration voltage: 20 kV). After the development with a solvent mixture of water and 2-propanol in a volume ratio of 9:1, an excellent negative pattern was obtained.

EXAMPLE 9

The coating film of the polyacid having a peroxo group prepared in Example 6 was subjected to an electron beam delineation with a dose of $2 \times 10^{-5}$ C/cm$^2$ and then developed in the same manner as in Example 8 to obtain an excellent negative pattern.

EXAMPLE 10

Figure 1B:
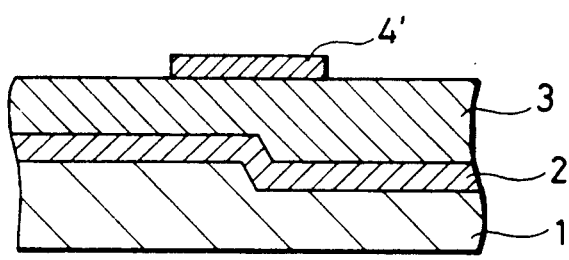
Figure 1C:
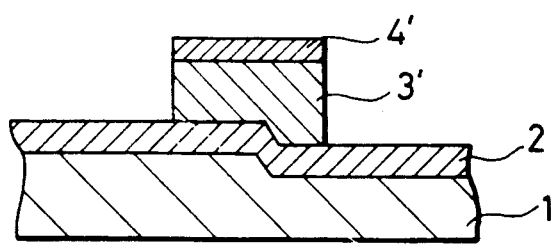

An aluminum film 2 to be processed was formed on a Si substrate 1 having a step on the surface thereof as shown in FIG. 1(a). Deep-UV resist polymethyl methacrylate (Elvacite 2041; a trade name of Du Pont) was spin-coated thereon and heated at 160° C. for 30 min to form a bottom organic polymer layer 3 and to level the step. 2-Ethoxyethanol was added to a solution of 1 part by weight of a polyacid comprising tungsten and niobium in 1 part by weight of water prepared in the same manner as in Example 1 and the mixture was applied thereto by spin-coating to form an upper resist layer 4 comprising the polyacid and having a thickness of 0.1 μm. Then, the substrate was exposed to a light of a 600 W Xe-Hg lamp at a distance of 35 cm through a filter which transmits the light of a wavelength of 280 to 330 nm and a chromium mask for 1 sec. After the exposure followed by the development with a developer comprising dilute sulfuric acid having a pH of 2, the resist film in an unexposed region was removed by dissolution to form an intended resist pattern 4' as shown in FIG. 1(b). Then, the bottom polymethyl methacrylate layer was exposed to a light of a wave length of 200 to 300 nm through the resist pattern 4' as the exposure mask. Then, the polymethyl methacrylate layer was developed with chlorobenzene to form a pattern 3' and 4' having a good shape and a high dimensional accuracy as shown in FIG. 1(c).

EXAMPLE 11

A bottom layer was formed in the same manner as in Example 10 except that polymethyl methacrylate was replaced with a novolac resin/diazonaphthoquinone resist (trade name: AZ 1350 J) to form an organic polymer film 3 by the spin coating and it was heated at 200° C. for 1 h. 2-Ethoxyethanol was added to a solution of 1 part by weight of the polyacid comprising tungsten and niobium prepared in Example 7 in 1 part by weight of water and the mixture was spin-coated thereon to form an upper resist layer 4 comprising a coating film of the polyacid having a thickness of 0.1 μm. The bottom novolac resin layer was removed by the reactive ion etching with oxygen gas using the pattern 4' shown in FIG. 1(b) as the etching mask. As a result, patterns 3' and 4' each having a good shape and a high dimensional accuracy as shown in FIG. 1(c) were formed.

EXAMPLE 12

A conductor aluminum was vapor-deposited on a silicon wafer for semiconductor devices. The aqueous solution of the polyacid comprising tungsten and niobium prepared in Example 1 was applied to the wafer used as the substrate by the spin coating. It was exposed to X-rays through an X-ray mask. The X-ray source was of an electron cathode type with a molybdenum target. The electron acceleration voltage was 20 kV and the tube current was 500 mA. The X-ray does was 100 mJ/cm$^2$. After the development with a developer comprising water and isoproponal ($\frac{1}{8}$) for 30 sec, a resist pattern was formed. After the post backing conducted at 100° C. for 20 min, the reactive ion etching of aluminum was conducted. The etching gas was BCl$_3$ and the RF power was 500 W. Then, the resist was removed by washing with water to obtain an aluminum conductor pattern.

In this example, a fine pattern of the polyacid resist with a practical sensitivity could be formed by the X-ray exposure. By using the pattern as the mask, an aluminum wire working with a high accuracy was possible.

EXAMPLE 13

Photoresist AZ 1350J was applied to a silicon wafer coated with PSG (phosphorus-containing silicon glass) as the insulator for semiconductor devices to form a film having a thickness of 2 μm. After baking at 200° C. for 30 min, the aqueous solution of the polyacid prepared in Example 1 was applied thereto by the spin coating. After the exposure to X-ray followed by the development conducted in the same manner as in Example 12, a pattern of the polyacid resist was formed. Then, the bottom AZ 1350J layer was etched by RIE (reactive ion etching) with oxygen using the resist film as the mask. Thereafter, the bottom PSG layer was etched by RIE using the AZ 1350J layer as the mask. The etching reaction gas was a mixture of CHF$_3$ and O$_2$ (4%) and the RF power was 500 W. The polyacid film was removed by washing with water and then the AZ 1350J layer was removed by oxygen plasma ashing.

In this example, the bi-layer resist process with a quite high accuracy could be provided because of a high resolution in the X-ray exposure and an excellent durability to the oxygen ion etching of the polyacid resist.

EXAMPLE 14

70 ml of a 15% aqueous H$_2$O$_2$ solution was added to a mixture of 9.93 g of metallic tungsten powder (average particle diameter: 1 μm) and titanium carbide powder (average particle diameter: 1 μm) to prepare a highly strong acidic solution. A platinized platinum net was immersed in the solution to remove excess H$_2$O$_2$ by decomposition. After drying, a reddish brown amorphous solid was obtained, which was a peroxopolyacid comprising tungsten and titanium as the metal element components and having a molar ratio of Ti to (Ti+W) of 0.1. In the infrared spectra of the product, characteristic bands were observed at 1340, 970, 880 and 550 cm$^{-1}$ in addition to bands due to the water molecules. When the solid was thermally decomposed, oxygen was released, indicating that the peroxo group was contained therein. In the Raman spectra of an aqueous solution of the solid, characteristic scattering signals were observed at 965, 880, 610 and 560 cm$^{-1}$.

1 part by weight of the peroxopolyacid comprising tungsten and titanium as the metal element components prepared as above was dissolved in 3 parts by weight of water to prepare a resist solution. The resist solution was applied by the spin coating to a silicon wafer having an oxide film formed thereon and then dried to obtain a coating film having a thickness of about 0.1 μm. Then, the substrate was exposed to a light of a 600 W Xe-Hg lamp at a distance of 35 cm through a chromium mask for 5 sec. After the exposure followed by the development with an aqueous solution of sulfuric acid having a pH of 2, the resist film in an unexposed region was removed by dissolution to form a recurring pattern of alternative lines having a width of 0.5 μm and spaces having a width of 0.5 μm.

EXAMPLE 15

The coating film of the peroxopolyacid comprising tungsten and titanium as the metal element components prepared in Example 14 was irradiated with 20 μC/cm$^2$ of electron beams (acceleration voltage: 30 kV). After the development with an aqueous solution of sulfuric acid having a pH of 2, an excellent negative pattern was obtained.

EXAMPLE 16

The coating film of the peroxopolyacid comprising tungsten and titanium as the metal element components prepared in Example 14 was irradiated with 180 mJ/cm$^2$ of X-rays (Mo L rays) and then developed with an aqueous solution of sulfuric acid having a pH of 2 to obtain an excellent negative pattern.

EXAMPLES 17 TO 19

Polyacids comprising tungsten and titanium as the metal element components and having a molar ratio of Ti to (W+Ti) of 0.05 (Example 17), 0.2 (Example 18) and 0.3 (Example 19) were prepared in the same manner as in Example 14 except that the ratio of metallic tungsten powder to titanium carbide was varied with the proviso that the total amount of the two was 0.06 mol.

Coating films were prepared therefrom in the same manner as in Example 14. They were exposed to a light of a 600 W Xe-Hg lamp at a distance of 35 cm and then developed with a developer having a pH of 2 to obtain an excellent negative pattern. The minimum exposure times for the patterning were as shown in Table 2.

TABLE 2

| Example | Molar ratio of Ti/(Ti + W) | Minimum exposure time (sec) |
| --- | --- | --- |
| 17 | 0.05 | 5 |
| 14 | 0.1 | 5 |
| 18 | 0.2 | 3 |
| 19 | 0.3 | 7 |
| Comp. Ex. | 0 | 900 |

In the comparative example shown in Table 2, the peroxopolyacid comprised only tungsten as the metal element component and was free of titanium. From the results, the effects of titanium contained therein are apparent.

EXAMPLE 20

A mixture of 9.93 g of metallic tungsten powder and 0.287 g of metallic titanium powder (particle diameter: 1.0 μm) was dissolved in 70 ml of a 15% aqueous solution of H$_2$O$_2$ and then the same procedure as in Example 14 was repeated to obtain a reddish brown amorphous solid. The infrared spectrum of the product was the same as that of the solid obtained in Example 14 except that a band at 1340 cm$^{-1}$ was not observed in the former. It was, therefore, a peroxopolyacid comprising tungsten and titanium as the metal element components but free of carbon as the hetero atom.

A coating film was formed therefrom and the film was exposed and developed in the same manner as in Example 1 to obtain an excellent negative pattern. The minimum exposure time for patterning was 6 sec. It was apparent, therefore, that the peroxopolyacid comprising tungsten and titanium as the metal element components but free of a carbon atom as the hetero atom had the same photo sensitivity as that of the carbon-containing peroxopolyacid.

EXAMPLE 21

A resist film of a peroxopolyacid comprising tungsten and titanium as the metal element components was formed on a layer of a polyimide resin (PIQ; a trade name of Hitachi Chemical Co., Ltd.) formed on a silicon substrate in the same manner as in Example 14. After the exposure followed by the development conducted in the same manner as in Example 14, the recurring inorganic resist pattern having distances of 0.5 μm was formed on the bottom PIQ layer. Then, oxygen ion etching was conducted under conditions comprising 100 W and oxygen pressure of 10$^{-3}$ Torr for 1 h and the inorganic resist pattern on the upper layer was transferred to the bottom PIQ layer to form the recurring PIQ pattern having pattern width of 0.5 μm.

EXAMPLE 22

The same procedure as in Example 14 was repeated for preparing the peroxopolyacid except that 9.9 g of metallic tungsten powder, 0.63 g of niobium carbide powder and 0.36 g of titanium carbide powder were dissolved in 70 ml of a 15% H$_2$O$_2$ solution to prepare a peroxopolyacid comprising tungsten, niobium and titanium as the metal element components. The molar ratio of niobium or titanium to the metal elements was 0.1. 1 part by weight of the peroxopolyacid thus obtained was dissolved in 3 parts by weight of water to prepare a photoresist solution. The solution was applied to a silicon wafer by spin coating to form a coating film having a thickness of 0.1 μm, which was exposed for 5 sec and then developed in the same manner as in Example 14 to obtain a fine pattern similar to that obtained in Example 14.

EXAMPLE 23

The resist film prepared in Example 14 was developed with a developer prepared as follows: an aqueous solution (A) of sulfuric acid comprising 0.49 g/l of H$_2$SO$_4$ and having a pH of 2 was mixed with an aqueous solution (B) of 12 g/l of acetic acid and 15 g/l of sodium acetate. The exposed sample prepared as above was immersed in the mixture to dissolve an unexposed region and to prepare a resist pattern. Changes in the normalized resist thickness (the ratio of the film thickness before the development to that after the development of the resist pattern and the rising angle of the resist pattern from the substrate observed when the developers comprising A and B in various volume ratios were used are shown in Table 3.

TABLE 3

| Volume ratio of B/A in developer | Normalized resist thickness | Rising angle of pattern (deg) |
|---|---|---|
| 0 | 0.5 | 10 |
| 0.1 | 0.7 | 30 |
| 0.5 | 0.9 | 50 |
| 1 | 0.9 | 70 |
| 2 | 0.8 | 70 |

It is apparent from Table 3 that the contrast of the resist pattern was improved by the addition of sodium acetate to the developer.

EXAMPLE 24

A peroxopolyacid comprising tungsten and tantalum was prepared as follows. 8 g of metallic tungsten powder was placed in a beaker and 70 ml of a 15% aqueous solution of $H_2O_2$ was added thereto. The tungsten powder was dissolved by a vigorous reaction accompanied with foaming and an acidic, pale yellow solution of peroxopolytungstic acid was obtained. 10 g of ethanol was placed in another beaker and then 2 g of tantalum ethoxide [$Ta(OC_2H_5)_5$] was dissolved therein. The solution was added dropwise to 30 ml of 15% $H_2O_2$ under stirring to obtain a substantially transparent, colorless solution of peroxotantalic acid in water/alcohol. The solution was added to the peroxopolytungstic acid solution and the mixture was left to stand at room temperature for 24 h. Then, a small amount of an insoluble or unsolved matter remaining therein was removed by filtration to obtain a clear solution. A platinized platinum net was immersed therein to decompose unreacted $H_2O_2$. It was airdried at room temperature to obtain a pale yellow, amorphous solid. According to the results of the elemental analysis and thermal analysis, the product had the following empirical formula:

$$(1-x)WO_3 \cdot x/2 Ta_2O_5 \cdot yH_2O_2 \cdot zH_2O$$

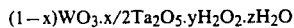

wherein $x \approx 0.1$, $0 < y \leq 1$ and $0.16 < z < 4$.

A reason why the values of y and z are given not definitely but in the ranges is that they vary depending on the conditions which cannot be controlled easily, such as the time for which the material is left to stand in the course of the preparation, drying conditions, degree of removal of excess $H_2O_2$ and humidity in the storing atmosphere.

1 part by weight of the obtained peroxopolyacid comprising tungsten and tantalum was dissolved in 1 part by weight of water. 2-Ethoxyethanol was added to the solution to prepare a resist solution. This solution was applied to a silicon wafer having an oxide layer formed thereon by spin coating. After drying, a coating film having a thickness of about 0.1 μm was obtained. Then, the substrate was exposed to a light of a 600 W Xe-Hg lamp at a distance of 35 cm through a chromium mask for 1 sec. After the exposure for 0.5 sec followed by the development with an aqueous sulfuric acid solution having a pH of 2, the resist film in an unexposed region was removed by dissolution to form a pattern composed of recurring, alternate lines having a width of 0.5 μm and spaces having a width of 0.5 μm.

EXAMPLES 25 TO 28

4.4 g of tantalum ethoxide was dissolved in 20 g of ethanol. The solution was added dropwise to 50 ml of a 15% aqueous solution of $H_2O_2$ to obtain a solution of peroxopolytantalic acid. This solution was added to the same solution of peroxopolytungstic acid as in Example 24 and then the same procedure as in Example 24 was repeated to obtain a peroxopolyacid comprising tungsten and tantalum and having a molar ratio of Ta to (W+Ta) of 0.2.

Three peroxopolyacids having varied Ta to (W+Ta) molar ratios as shown in Table 4 were prepared in the same manner as above. Resist solutions were prepared from the peroxopolyacids in the same manner as in Example 24 and the 0.5 μm recurring pattern was formed in the same manner as in Example 24. The minimum exposure times for the patterning are also shown in Table 4. In the comparative example shown in Table 4, the peroxopolyacid comprised only tungsten which was prepared from only metallic tungsten powder in the same manner as in Example 24. The results obtained in the comparative example are those of the resist material shown in Japanese Patent Laid-Open No. 114081/1985.

It is apparent from Table 4 that an exposure time of 0.2 to 0.5 sec was enough when the photoresist materials comprising the polyacid comprising tungsten and tantalum in Examples 24 to 28 of the present invention were used, while 90 sec was necessitated for forming the 0.5 μm line-and-space recurring pattern in the comparative example in which the ordinary photoresist material comprising the peroxopolyacid comprising only tungsten was used. The resistivity-improving effect of tantalum is apparent from these results.

TABLE 4

| Example | Molar ratio of Ta to (W + Ta) in polyacid | Minimum exposure time for patterning (sec) |
|---|---|---|
| 24 | 0.1 | 0.5 |
| 25 | 0.2 | 0.3 |
| 26 | 0.3 | 0.2 |
| 27 | 0.4 | 0.2 |
| 28 | 0.5 | 0.2 |
| Comp. Ex. | 0 | 90 |

The tungsten-free peroxopolyacid comprising only tantalum turned into a gel phase in the course of the condensation and drying and the intended product suitable for use as a photoresist material could not be obtained.

EXAMPLE 29

A peroxopolyacid comprising carbon in addition to tungsten and tantalum having the following formula was prepared in the same manner as in Example 24 except that the metallic tungsten was replaced with 8.5 g of tungsten carbide:

$$(1-x)WO_3 \cdot x/2 Ta_2O_5 \cdot yH_2O_2 \cdot zH_2O \cdot wCO_2$$

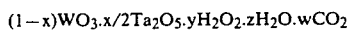

wherein $x = 0.1$, $0 < y \leq 1.0$, $0.16 < z < 4$ and $0 < w \leq 0.25$.

The values of y and z were given not definitely but in the ranges for the same reasons as in Example 24. When the solution was dried in 30 h, w was nearly 0.25 and when it was dried after leaving to stand for 500 h, w was about 0.02. The infrared spectra of the condensate were substantially the same as those of the carbon-free polyacids prepared in Examples 24 to 28 except that a band due to carbon was observed at 1300 to 1400 cm$^{-1}$ in the former. It was supposed from this fact that the presence of carbon exerts no influence on the basic structure of the polyacids.

A resist solution was prepared from the carbon-containing polyacid in the same manner as in Example 24. Further, 0.5 μm line-and-space pattern could be formed in the same manner as in Example 24. The exposure time for patterning was about 0.5 sec. The resistivity of the polyacid prepared in this example was thus the same as that of the carbon-free polyacid prepared in Example 24.

EXAMPLE 30

1 part by weight of the peroxopolyacid prepared in Example 29 was dissolved in 1 part by weight of water. 2-Ethoxyethanol was added to the solution to prepare a resist solution. The solution was applied to a silicon wafer having an oxide layer formed thereon by spin coating. After drying, a coating film having a thickness of about 0.1 μm was obtained. The coating film was exposed and developed in the same manner as in Example 24 to obtain the results similar to those obtained in Example 24.

EXAMPLE 31

The coating film of the polyacid comprising tungsten and tantalum prepared in Example 25 was irradiated with $7 \times 10^{-6}$ C/cm$^2$ of electron beams (acceleration voltage: 30 kV) according to a given pattern. After the development with a solvent mixture of water and 2-propanol in a volume ratio of 9:1, an excellent negative pattern was obtained.

EXAMPLE 32

The coating film of the polyacid having a peroxo group prepared in Example 29 was irradiated with $7 \times 10^{-6}$ C/cm$^2$ of electron beams and then developed in the same manner as in Example 31 to obtain an excellent negative pattern.

EXAMPLE 33

An aluminum film 2 to be processed was formed on a silicon substrate 1 having a step on the surface thereof as shown in FIG. 1(a). Deep-UV resist polymethyl methacrylate (Elvacite 2041; a trade name of Du Pont) was applied thereto by spin coating and heated at 160° C. for 30 min to form a bottom organic polymer film 3 and to level the step. A resist solution of the polyacid comprising tungsten and tantalum prepared in the same manner as in Example 25 was applied to the film 3 by spin coating to form an upper resist layer 4 comprising the polyacid coating film having a thickness of 0.1 μm. Then, the upper resist layer 4 on the substrate 1 was exposed to a light of a 600 W Xe-Hg lamp at a distance of 35 cm through a filter which transmitted the light of 280 to 330 nm and a chromium mask for 0.3 sec. After the exposure followed by the development with a developer comprising dilute sulfuric acid having a pH of 2, the resist film in an unexposed region was removed by dissolution to form an intended resist pattern 4' as shown in FIG. 1(b). Then, the bottom polymer film 3 comprising the polymethyl methacrylate was exposed to a light of a wave length of 200 to 300 nm through the resist pattern 4' as the exposure mask. Then, the polymethyl methacrylate layer 3 was developed with chlorobenzene to form patterns 3' and 4' each having a good shape and a high dimensional accuracy as shown in FIG. 1(c).

EXAMPLE 34

A bottom layer was formed in the same manner as in Example 33 except that polymethyl methacrylate was replaced with a novolac resin/diazonaphthoquinone resist AZ 1350 J; trade name of Hoechst) to form the organic polymer film by the spin coating and then the film was heated at 200° C. for 1 h. The resist solution of the polyacid comprising tungsten and tantalum prepared in Example 30 was applied thereto by spin coating. After drying, an upper resist film 4 comprising the polyacid coating film having a thickness of 0.1 μm was obtained. A pattern 4' shown in FIG. 1(b) was formed thereon in the same manner as in Example 33. Then, the bottom novolac resin film 3 was removed by the reactive ion etching with oxygen gas using the resist pattern 4' as the etching mask. As a result, patterns 3' and 4' each having a good shape and a high dimensional accuracy as shown in FIG. 1(c) were formed.

EXAMPLE 35

A conductor aluminum was vapor-deposited on a silicon wafer for semiconductor devices. The aqueous solution of the polyacid comprising tungsten and tantalum prepared in Example 25 was applied to the aluminum film by spin coating and then dried. The resist film thus formed was exposed to X-rays through an X-ray mask. The X-ray source was of an electron cathode type with a molybdenum target. The electron acceleration voltage was 20 kV and the tube current was 500 mA. The X-ray dose was 80 mJ/cm$^2$. After the development with a developer comprising water and 2-propanol (⅓) for 30 sec, a resist pattern was formed. After the post-baking conducted at 100° C. for 20 min, the reactive ion etching of aluminum was conducted. The etching gas was $BCl_{13}$ and the RF power was 500 W. Then, the remaining resist was removed by washing with water to obtain an aluminum conductor pattern.

In this example, a fine pattern of the polyacid resist with a practical sensitivity could be formed by the X-ray exposure. By using the pattern as the mask, an aluminum wire working with a high accuracy was possible.

EXAMPLE 36

Photoresist AZ 1350 J was applied to a silicon wafer coated with PSG (phosphorus-containing silicon glass) as the semiconductor device insulator to form a film having a thickness of 2 μm. After baking at 200° C. for 30 min, the polyacid resist solution prepared in Example 24 was applied to the AZ 1350 J layer by spin coating and then dried. After the exposure to X-rays followed by the development conducted in the same manner as in Example 35, a pattern was formed on the polyacid resist film. Then, the bottom AZ 1350 J layer (photoresist film) was etched by RIE (reactive ion etching) with oxygen using the polyacid resist film pattern as the mask. Thereafter, the bottom PSG layer was etched by RIE using the AZ 1350 J photoresist film pattern as the mask. The etching reaction gas used was a mixture of $CHF_3$ and $O_2$ (4%) and the RF power was 500 W. The remaining polyacid film was removed by washing with water and then the AZ 1350 J photoresist film was removed by ashing with oxygen plasma.

In this example, the bi-layer resist process with a quite high accuracy could be provided because of a high resolution in the X-ray exposure and excellent durability to the oxygen ion etching of the polyacid resist.

EXAMPLE 37

A solution of peroxopolytantalic acid prepared in the same manner as in Example 24 was added to a solution of a polyacid comprising tungsten and niobium prepared in the same manner as in Example 1 and then the same procedure as in Example 24 was repeated to obtain a peroxopolyacid comprising tungsten, niobium and tantalum and having a molar ratio of niobium or tantalum to the metallic elements of 0.2. 1 part by weight of the polyacid thus obtained was dissolved in 1 part by weight of water. 2-Ethoxyethanol was added to the solution to prepare a resist solution. The resist solution was applied to a silicon wafer by spin coating to form a coating film having a thickness of 0.1 μm. After the delineation with $7 \times 10^{-6}$ C/cm$^2$ of electron beams (acceleration voltage: 30 kV) conducted in the same manner as in Example 31 followed by the development with the same aqueous solution (B) as in Example 23 and the removal of an unexposed region by dissolution, an excellent negative pattern was obtained.

EXAMPLES 38 TO 40

Three peroxopolyacids comprising tungsten, niobium and tantalum and having varied molar ratio of niobium to tantalum as shown in Table 5 were prepared in the same manner as in Example 37. 1 part by weight of each of the peroxopolyacids was dissolved in 1 part by weight of water and then 2-ethoxyethanol was added thereto to obtain a resist solution. This solution was applied to a silicon wafer by spin coating to form a coating film having a thickness of 0.1 μm. After the electron beam delineation (acceleration voltage: 30 kV), the development was conducted in the same manner as in Example 37. The minimum dose for the patterning is also shown in Table 5. The peroxopolyacid in the comparative example shown in Table 5 comprised only tungsten as the metal element which was prepared from only tungsten metal powder in the same manner as in Example 24. The results shown in Table 5 were those of a resist material disclosed in Japanese Patent Laid-Open No. 114081/1985. The effects of niobium and tantalum for improving the sensitivity are apparent from Table 5.

TABLE 5

| Example | Molar ratio of elements in polyacid | | Minimum dose ($10^{-6}$ C/cm$^{-2}$) |
|---|---|---|---|
| | Nb | Ta | |
| 38 | 0.1 | 0.1 | 20 |
| 37 | 0.2 | 0.2 | 7 |
| 39 | 0.3 | 0.2 | 10 |
| 40 | 0.2 | 0.3 | 10 |
| Comp. Ex. | 0 | 0 | 100 |

EXAMPLE 41

A PIQ resin film having a thickness of 1.5 μm was formed on a silicon wafer in the same manner as in Example 21. Then, the resist solution of peroxopolyacid comprising tungsten, niobium and tantalum as the metal elements prepared in Example 37 was applied to the PIQ resin film by spin coating to form an upper resist layer having a thickness of 0.1 μm. After the electron beam delineation followed by the development conducted in the same manner as in Example 31, the polyacid resist pattern (0.5 μm distances) was formed on the PIQ film. Then, the reactive ion etching with oxygen (O$_2$-RIE) was conducted under conditions comprising an oxygen partial pressure of $10^{-3}$ torr, RF power of 100 W and etching time of 1 h to transfer the pattern from the upper layer to the bottom layer. Thus, the PIQ pattern (0.5 μm distances) was obtained.

As described above, the inorganic resist films having a high sensitivity can be formed by the easy, inexpensive spin coating method according to the present invention. The industrial value of the present invention is thus high.

What is claimed is:

1. An inorganic resist comprising a polytungstic acid having peroxo groups which contains at least one metal selected from the group consisting of niobium, titanium and tantalum.

2. An inorganic resist according to claim 1, wherein the acid is a peroxopolyacid of the general formula:

$$(1 - x - l)WO_3 \cdot \frac{x}{2} Nb_2O_5 \cdot lTiO_2 \cdot yH_2O_2 \cdot zH_2O \cdot mCO_2$$

wherein x, y, z, l and m are numerals in the following ranges: $0 < x + l < 1$, $0 < y \leq 1$, $0.16 < z < 4$ and $0 \leq m \leq 0.25$.

3. An inorganic resist according to claim 2, wherein the numeral of x+l is in the range of $0 \leq x+l \leq 0.5$.

4. An inorganic resist according to claim 1, wherein the acid is represented by the general formula:

$$(1-x)WO_3 \cdot x/2 Ta_2O_5 \cdot yH_2O_2 \cdot zH_2O \cdot wCO_2$$

wherein $0 < x < 1$, $0 < y \leq 1$, $0.16 < z < 4$ and $0 \leq w \leq 0.25$.

5. An inorganic resist according to claim 1, wherein the acid is represented by the general formula:

$$(1 - x - l)WO_3 \cdot \frac{x}{2} Nb_2O_5 \cdot \frac{l}{2} Ta_2O_5 \cdot H_2O_2 \cdot yH_2O_2 \cdot zH_2O \cdot mCO_2$$

wherein x, y, z, l and m are numerals in the following ranges: $0 < x + l < 1$, $0 < y \leq 1$, $0.16 < z < 4$ and $0 \leq m \leq 0.25$.

6. An inorganic resist according to claim 5, wherein the numeral of x+l is in the range of $0 < x+l \leq 0.5$.

* * * * *